United States Patent
Choi

(10) Patent No.: US 9,706,661 B2
(45) Date of Patent: Jul. 11, 2017

(54) ELECTRONIC DEVICE MODULE AND MANUFACTURING METHOD THEREOF

(71) Applicant: SAMSUNG ELECTRO-MECHANICS CO., LTD., Suwon-Si (KR)

(72) Inventor: Seung Yong Choi, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/608,482

(22) Filed: Jan. 29, 2015

(65) Prior Publication Data

US 2015/0325529 A1   Nov. 12, 2015

(30) Foreign Application Priority Data

May 7, 2014   (KR) .................. 10-2014-0054047

(51) Int. Cl.
*H01L 23/34* (2006.01)
*H05K 1/18* (2006.01)
(Continued)

(52) U.S. Cl.
CPC ............ *H05K 1/181* (2013.01); *H01L 21/50* (2013.01); *H01L 21/561* (2013.01); *H01L 23/13* (2013.01); *H01L 23/5385* (2013.01); *H01L 23/552* (2013.01); *H01L 24/97* (2013.01); *H01L 25/105* (2013.01); *H01L 21/563* (2013.01); *H01L 23/3128* (2013.01); *H01L 23/5389* (2013.01); *H01L 2224/16225* (2013.01); *H01L 2224/97* (2013.01); *H01L 2225/1023* (2013.01); *H01L 2225/1058* (2013.01); *H01L 2225/1088* (2013.01); *H01L 2924/15192* (2013.01); *H01L 2924/15311* (2013.01);
(Continued)

(58) Field of Classification Search
CPC ............................. H01L 21/50; H01L 23/552
See application file for complete search history.

(56) References Cited

U.S. PATENT DOCUMENTS

| 6,686,649 B1 * | 2/2004 | Mathews ............... H01L 23/552 257/659 |
| 2007/0108582 A1 * | 5/2007 | Karnezos ............ H01L 23/3128 257/686 |

(Continued)

FOREIGN PATENT DOCUMENTS

| JP | 2008-124167 | 5/2008 |
| KR | 10-0782774 B1 | 11/2007 |

(Continued)

OTHER PUBLICATIONS

Korean Office Action issued on Jul. 2, 2015 in counterpart Korean Application No. 10-2014-0054047.

*Primary Examiner* — Marc Armand
*Assistant Examiner* — Sarah Salerno
(74) *Attorney, Agent, or Firm* — NSIP Law

(57) ABSTRACT

An electronic device module includes a first substrate having at least one or more electronic devices mounted on one surface thereof, a second substrate bonded to one surface of the first substrate and including at least one device accommodating part having a space in which the electronic device is accommodated, and a shielding member disposed in the device accommodating part and accommodating at least one or more electronic devices therein.

9 Claims, 13 Drawing Sheets

(51) Int. Cl.
  *H01L 21/50*    (2006.01)
  *H01L 23/13*    (2006.01)
  *H01L 21/56*    (2006.01)
  *H01L 23/538*   (2006.01)
  *H01L 23/552*   (2006.01)
  *H01L 23/00*    (2006.01)
  *H01L 25/10*    (2006.01)
  *H01L 23/31*    (2006.01)
  *H05K 1/02*     (2006.01)

(52) U.S. Cl.
  CPC .............. *H01L 2924/181* (2013.01); *H01L 2924/19105* (2013.01); *H01L 2924/19106* (2013.01); *H05K 1/023* (2013.01); *H05K 2201/1056* (2013.01); *H05K 2201/10371* (2013.01); *H05K 2201/10378* (2013.01); *H05K 2201/2018* (2013.01); *H05K 2203/1316* (2013.01); *H05K 2203/1327* (2013.01); *Y02P 70/611* (2015.11)

(56) References Cited

U.S. PATENT DOCUMENTS

| 2007/0273014 | A1  | 11/2007 | Lee et al. |
| 2008/0179717 | A1* | 7/2008  | Wu ............... H01L 23/552 257/659 |
| 2009/0166835 | A1* | 7/2009  | Yang ............. H01L 21/565 257/686 |
| 2011/0127653 | A1* | 6/2011  | Pagaila .......... H01L 23/3128 257/660 |
| 2011/0293128 | A1  | 12/2011 | Kuratani et al. |
| 2013/0127025 | A1  | 5/2013  | Cho |

FOREIGN PATENT DOCUMENTS

KR    10-2011-0132219 A    12/2011
KR         10-1274460 B1    6/2013

\* cited by examiner

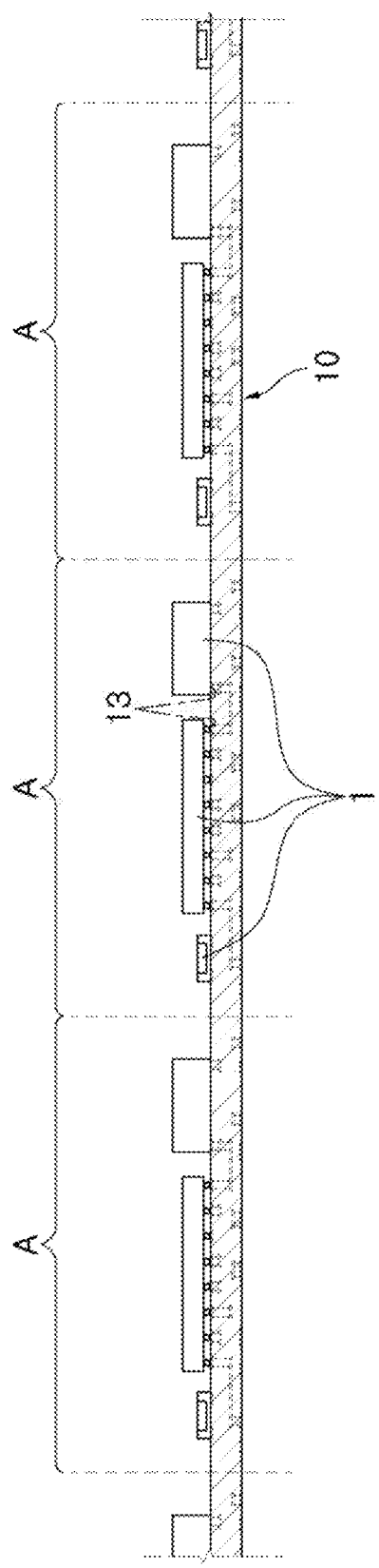

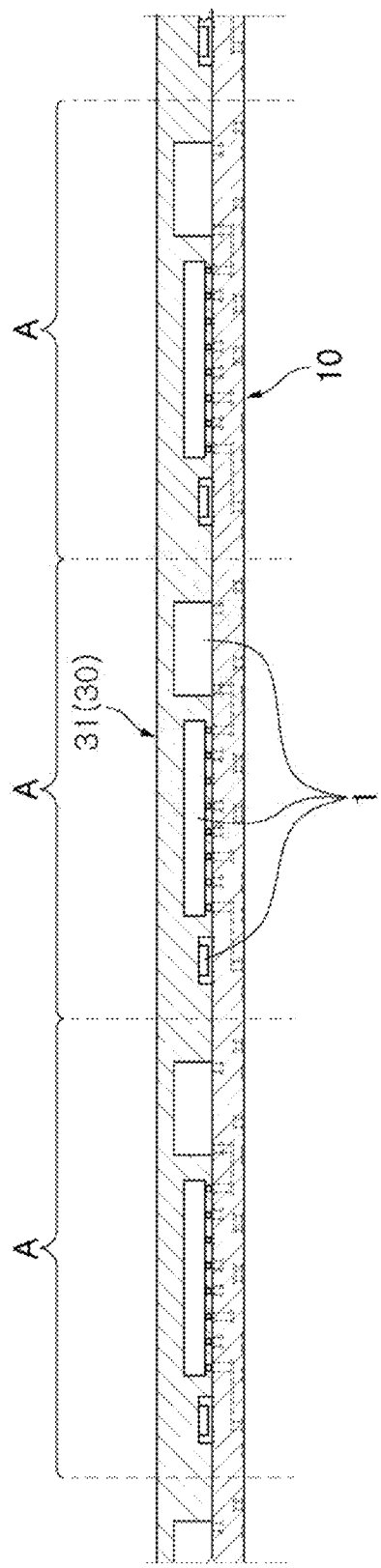

ELECTRONIC DEVICE MODULE AND MANUFACTURING METHOD THEREOF

CROSS-REFERENCE TO RELATED APPLICATION

This application claims the priority and benefit of Korean Patent Application No. 10-2014-0054047 filed on May 7, 2014, with the Korean Intellectual Property Office, the disclosure of which is incorporated herein by reference.

BACKGROUND

Some embodiments of the present disclosure may relate to an electronic device module having an improved degree of integration by mounting electronic components on both surfaces of a substrate, and a manufacturing method thereof.

In order to manufacture an electronic device module having a small size and high performance, a structure in which electronic components are mounted on both surfaces of a substrate may be used.

However, in the case in which the electronic components are mounted on both surfaces of the substrate, it is difficult to form external connection terminals on the substrate and to form a shielding film capable of shielding electromagnetic waves.

Therefore, a double-sided mounting-type electronic device module may need easier formation of the external connection terminals and the shielding film.

RELATED ART DOCUMENT (Patent Document 1) Korean Patent No. 10-0782774

SUMMARY

An aspect of the present disclosure may provide a double-sided mounting-type electronic device module in which electronic products may be mounted on both surfaces of a substrate.

An aspect of the present disclosure may also provide a double-sided mounting-type electronic device module having a shielding film, and a manufacturing method thereof.

According to an aspect of the present disclosure, an electronic device module may include: a first substrate having at least one or more electronic devices mounted on one surface thereof; a second substrate bonded to the surface of the first substrate and including at least one device accommodating part in which at least one or more electronic devices may be accommodated; and a shielding member disposed in the device accommodating part and accommodating the electronic device therein.

The shielding member may be formed in the device accommodating part and may be disposed along or on an outer surface of a molded portion sealing the electronic device. In addition, the shielding member may be formed to have a vessel shape having an internal space, and may be bonded to the second substrate or formed on an outer surface of the electronic device so that the electronic device is accommodated in the internal space.

According to another aspect of the present disclosure, an electronic device module may include: a first substrate having a plurality of electronic devices mounted on both surfaces thereof; a second substrate bonded to one surface of the first substrate and including at least one device accommodating part in which at least one electronic device is accommodated; and a shielding member shielding electromagnetic waves from being introduced into the electronic device disposed in the device accommodating part and/or shielding electromagnetic waves from being leaked from the electronic device.

According to another aspect of the present disclosure, a manufacturing method of an electronic device module may include: preparing a first substrate; mounting at least one or more electronic devices and a second substrate on one surface of the first substrate; and forming a shielding member on at least one electronic device.

According to another aspect of the present disclosure, a manufacturing method of an electronic device module may include: preparing a first substrate; and mounting at least one or more semiconductor packages and a second substrate on one surface of the first substrate. The semiconductor package may have a plurality of electronic components embedded in a molded portion, and the molded portion may have a shielding member disposed on an external portion thereof.

BRIEF DESCRIPTION OF DRAWINGS

The above and other aspects, features and other advantages of the present disclosure will be more clearly understood from the following detailed description taken in conjunction with the accompanying drawings, in which:

FIGS. 4A through 4I are cross-sectional views for describing a manufacturing method of an electronic device module according to an exemplary embodiment in the present disclosure.

DETAILED DESCRIPTION

Figure 1:
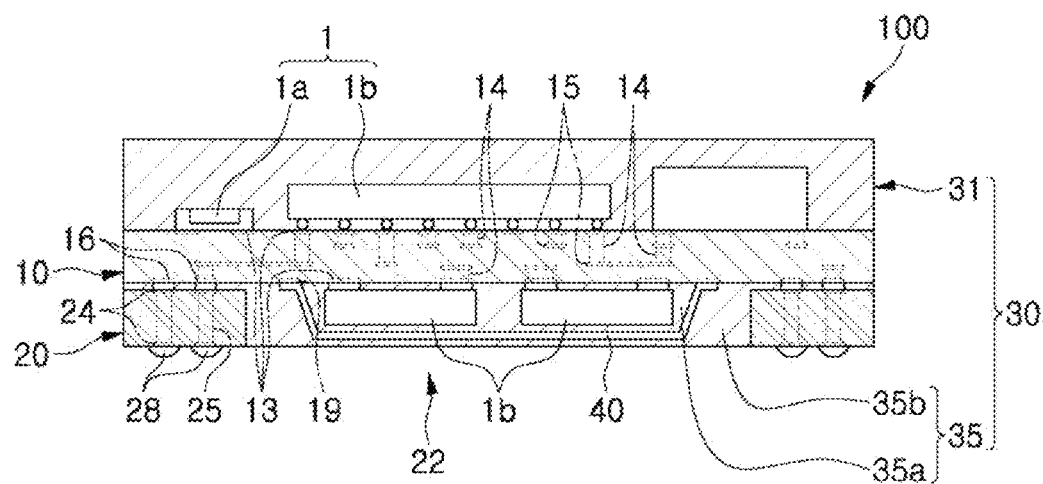
FIG. 1 is a cross-sectional view schematically showing an electronic device module according to an exemplary embodiment in the present disclosure.

Hereinafter, embodiments of the present disclosure will be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Figure 2:
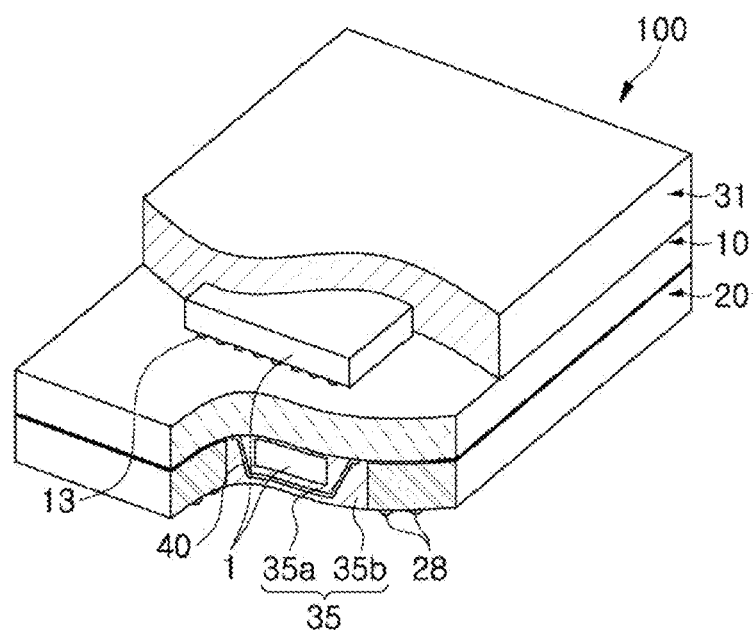
FIG. 2 is a partially cut-away perspective view showing an internal portion of the electronic device module shown in FIG. 1.

FIG. 1 is a cross-sectional view schematically showing an electronic device module according to an exemplary embodiment in the present disclosure; FIG. 2 is a partially cut-away perspective view showing an internal portion of the electronic device module shown in FIG. 1; and FIG. 3 is an exploded perspective view of the electronic device module shown in FIG. 1.

Figure 3:
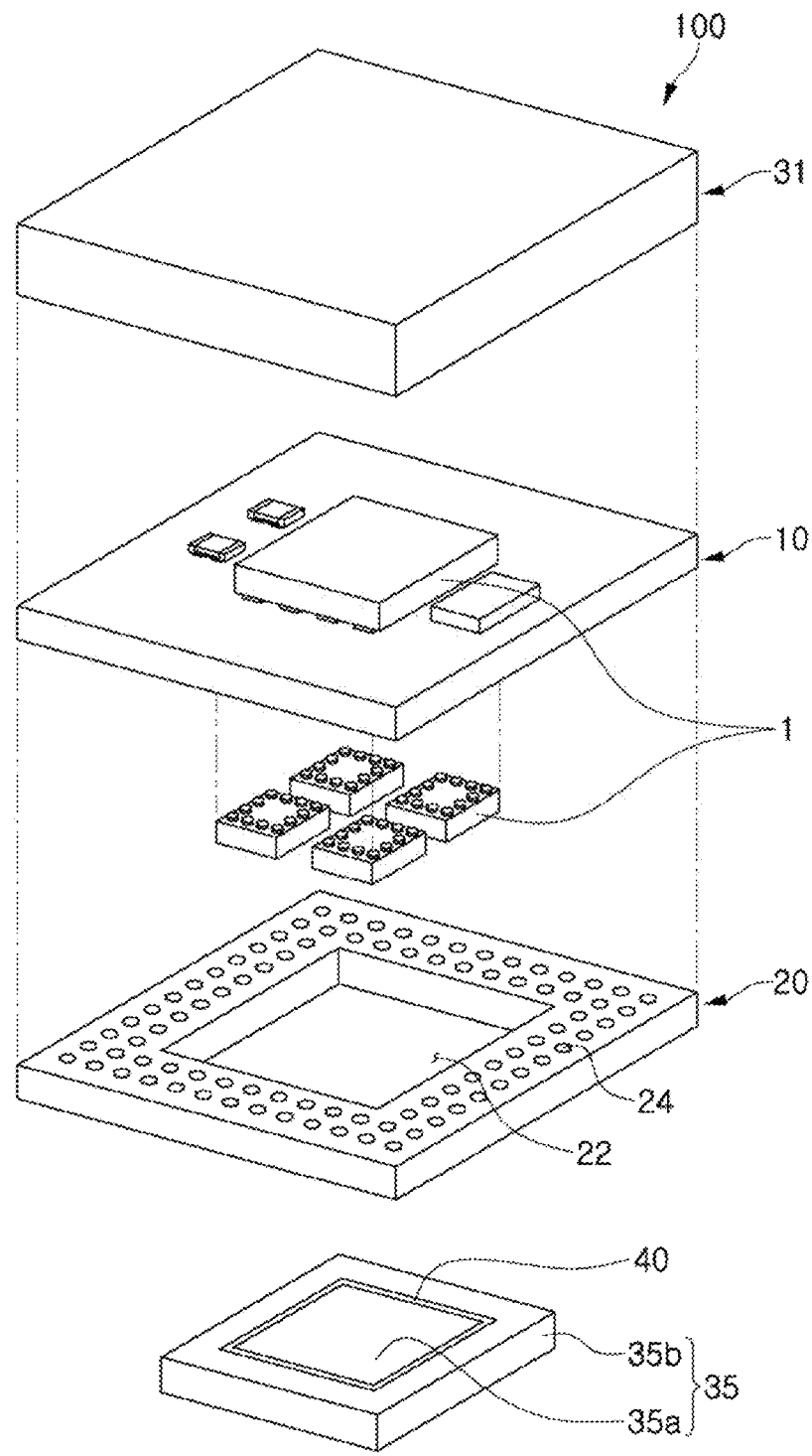
FIG. 3 is an exploded perspective view of the electronic device module shown in FIG. 1.

Referring to FIGS. 1 through 3, an electronic device module 100 according to the present exemplary embodiment may include electronic devices 1, a first substrate 10, a second substrate 20, and a molded portion 30.

The electronic devices 1 may include various devices such as a passive device 1a and an active device 1b, but not limited thereto, and may be any electronic devices 1 that may be mounted on a substrate.

The electronic devices 1 may be mounted on both upper and lower surfaces of the first substrate 10 to be described below. The case in which both of the active device 1b and the passive device 1a are mounted on the upper surface of the first substrate 10 and only the active device 1b is mounted on the lower surface of the first substrate 10 has been shown by way of example in FIG. 1. However, the present disclosure is not limited thereto. That is, the electronic devices 1 may be disposed in various forms and ways on both surfaces of the first substrate 10 depending on sizes or forms thereof and a design, operation and function of the electronic device module 100.

A substrate of the electronic device module 100 may include the first substrate 10 and the second substrate 20.

The first substrate 10 may be formed by stacking one or more insulating layers and metal wiring layers, and may have the electronic devices 1 mounted on both surfaces thereof.

As the first substrate 10, various kinds of substrates (for example, but not limited to, a ceramic substrate, a printed circuit board (PCB), a flexible substrate, and the like) well known in the art may be used. In addition, the first substrate 10 may have bonding pads 13, 16, and 19 formed on both surfaces thereof. Here, the bonding pads 13, 16, and 19 may include mounting electrodes 13 for mounting the electronic device 1, external connecting pads 16 for being electrically connected to the second substrate 20, and ground pads 19 for grounding a shielding member 40.

In addition, although not shown, wiring patterns electrically connecting the bonding pads 13, 16, and 19 to each other may be formed on the first substrate 10.

The first substrate 10 according to the present exemplary embodiment may be a multilayer substrate having a plurality of layers, for example, a substrate having four metal wiring layers.

In addition, the first substrate 10 according to the present exemplary embodiment may include conductive vias 14 electrically connecting the mounting electrodes 13 or the external connecting pads 16, formed on both surfaces thereof, and circuit patterns 15, formed therein, to each other.

Further, the first substrate 10 according to the present exemplary embodiment may include cavities (not shown) formed therein so that the electronic devices 1 may be embedded therein.

Further, the first substrate 10 according to the present exemplary embodiment may include the external connecting pads 16 formed on the lower surface thereof. The external connecting pads 16 may be provided in order to electrically connect the first substrate 10 to the second substrate 20 to be described below. The external connecting pads 16 may be connected to external connection terminals 28 through the second substrate 20.

Therefore, the external connecting pads 16 may be formed at positions facing an upper surface of the second substrate 20 when the second substrate 20 is coupled to the first substrate 10 on the lower surface of the first substrate 10, but not limited thereto, and the plurality of external connecting pads 16 may be disposed in various forms, if necessary.

The second substrate 20 may be disposed below the first substrate 10 and be coupled to the first substrate 10.

Further, the second substrate 20 according to the present exemplary embodiment may include a device accommodating part 22 formed therein. For example, the device accommodating part 22 has a through-hole shape. The device accommodating part 22 may be used as a space in which the electronic devices 1 mounted on the lower surface of the first substrate 10 are accommodated. Therefore, the electronic devices 1 mounted on the lower surface of the first substrate 10 may be mounted at positions facing the device accommodating part 22 of the second substrate 20, on the lower surface of the first substrate 10.

As the second substrate 20, various kinds of substrates (for example, a ceramic substrate, a printed circuit board (PCB), a flexible substrate, and the like) well known in the art may be used, similar to the first substrate 10.

In addition, the second substrate 20 may have electrode pads 24 formed on both surfaces thereof. The electrode pads 24 formed on the upper surface of the second substrate 20 may be provided in order to be electrically connected to the external connecting pads 16 of the first substrate 10. In addition, the electrode pads 24 formed on the lower surface of the second substrate 20 may be provided in order to be coupled to the external connection terminals 28.

Meanwhile, although not shown, wiring patterns electrically connecting the electrode pads 24 to each other may be formed on both surfaces of the second substrate 20. In addition, the second substrate 20 may include conductive vias 25 electrically connecting the electrode pads 24 formed on both surfaces thereof and circuit patterns 15 formed therein to each other.

For instance, the thickness of the second substrate 20 according to the present exemplary embodiment may be thicker than heights of the electronic devices 1 mounted on the lower surface of the first substrate 10 in order to stably protect the electronic devices 1 accommodated in the device accommodating part 22. However, a configuration of the present disclosure is not limited thereto.

The external connection terminals 28 may be coupled to the electrode pads 24 formed on the lower surface of the second substrate 20. For example, the external connection terminals 28 may be formed to have a form of a solder ball or a solder bump and be formed by a solder printing method having good productivity.

The external connection terminals 28 may electrically and/or physically connect the electronic device module 100 and a main board (not shown), on which the electronic device module 100 is mounted, to each other.

The external connection terminals 28 may be electrically connected to the electrode pads 24 formed on the upper surface of the second substrate 20 through the conductive vias 25, or the like. Therefore, in the case in which the second substrate 20 is coupled to the first substrate 10, the first substrate 10 may be electrically connected to the external connection terminals 28 through the second substrate 20.

The molded portion 30 may be formed on at least one or both surfaces of the first substrate 10. In the present exemplary embodiment, the molded portion 30 may be formed on both surfaces of the first substrate 10 to seal the electronic devices 1.

The molded portion 30 may be filled between the electronic devices 1 mounted on the first substrate 10 to prevent an electrical short-circuit generated between the electronic devices 1. In addition, the molded portion 30 may fix the electronic devices 1 onto the substrate while enclosing external portions of the electronic devices 1, thereby safely protecting the electronic devices 1 from external impact.

The molded portion 30 may be formed of, for example, but not limited to, an insulating material containing a resin material such as epoxy, or the like. In addition, the molded portion 30 according to the present exemplary disclosure may be formed by, for instance, disposing the first substrate 10 having the electronic devices 1 mounted on the upper surface thereof in a mold (not shown) and injecting a molding resin into the mold. However, the present disclosure is not limited thereto.

The molded portion 30 according to the present exemplary embodiment may include a first molded portion 31 and a second molded portion 35.

The first molded portion 31 may cover entire one surface of the first substrate 10 or the most of the surface. Although the case in which all of the electronic devices 1 are embedded in the first molded portion 31 has been described in the present exemplary embodiment, some of the electronic devices 1 may also be exposed to the outside of the first molded portion 31 or may not be embedded in the first molded portion 31, if necessary.

The second molded portion 35 may be filled in the device accommodating part 22 of the second substrate 20. However, the present disclosure is not limited thereto. For example, the second molded portion 35 may be formed outside the device accommodating part 22 of the second substrate 20 depending on a shape of the second substrate 20, if necessary.

Meanwhile, in the present exemplary embodiment, all of the electronic devices 1 accommodated in the device accommodating part 22 may be embedded in the second molded portion 35. However, some of the electronic devices 1 may be exposed to the outside of the second molded portion 35, if necessary.

In addition, an outer surface of the second molded portion 35 may not protrude outward toward the device accommodating part 22 or is concave inwardly of the device accommodating part 22 (that is, toward the first substrate 10), but the second molded part 35 may be coplanar to a plane formed by the lower surface of the first substrate 10.

However, the present disclosure is not limited thereto, but may be variously changed, if necessary. That is, the second molded portion 35 may be formed so that the outer surface thereof protrudes from the device accommodating part 22 or is concave.

The second molded portion 35 according to the present exemplary embodiment may have the shielding member 40 disposed therein.

The shielding member 40 may be formed to be embedded in the second molded portion 35, and may be formed to accommodate the electronic devices 1b mounted in the device accommodating part 22 therein and be electrically connected to the substrate.

Due to the shielding member 40, the second molded portion 35 may be divided into an inner molded portion 35a formed inside the shielding member 40 and an outer molded portion 35b formed outside the shielding member 40.

The shielding member 40 may be formed of various materials having conductivity in order to shield electromagnetic waves. For example, the shielding member 40 may be formed of a resin containing conductive powders or be completed by directly forming a metal thin film. In the case of forming the metal thin film, various technologies such as a sputtering method, a vapor deposition method, an electroplating method, an electroless plating method, and the like, may be used.

In the present exemplary embodiment, the shielding member 40 may be a metal thin film formed on the inner molded portion 35a by a spray coating method. The spray coating method may have advantages that a uniform coating film may be formed and costs required for equipment investment may be relatively low, as compared with other processes. However, the present disclosure is not limited thereto. A screen printing method or a painting method may be used to form the metal thin film as the shielding member 40. In addition, the shielding member 40 may be manufactured using a separate metal structure and be then bonded to the outer surface of the inner molded portion 35a.

Meanwhile, it may be preferable that the shielding member 40 is electrically connected to a ground in order to shield electromagnetic waves. To this end, for example, the shielding member 40 according to the present exemplary embodiment may be electrically connected to the ground pad 19 formed on the lower surface of the first substrate 10.

The shielding member 40 may shield the electronic devices 1b mounted on the lower surface of the first substrate 10 from electromagnetic waves generated from an external device such as the main board (not shown). In addition, the shielding member 40 may shield electromagnetic waves generated from the electronic devices 1b mounted on the lower surface of the first substrate 10 from being propagated to the main board. Therefore, deterioration of performance of the electronic device module 100 and occurrence of the problem due to electromagnetic waves may be prevented.

Meanwhile, although the case in which the second molded portion 35 includes the inner molded portion 35a and the outer molded portion 35b has been described by way of example in the present exemplary embodiment, the present disclosure is not limited thereto. For example, the second molded portion 35 may include only the inner molded portion 35a without the outer molded portion 35b.

Likewise, the second molded portion 35 may include only the outer molded portion 35b without the inner molded portion 35a. In this case, the second molded portion 35 may be separately manufactured, and may be coupled and bonded to the device accommodating part 22 after the shielding member 40 is formed on an inner surface of the second molded portion 35.

In the electronic device module 100 according to the present exemplary embodiment configured as described above, the electronic devices 1 may be mounted on both surfaces of the first substrate 10. In addition, the external connection terminals 28 may be formed by the second substrate 20 disposed on the lower surface of the first substrate 10.

Therefore, a plurality of electronic devices 1 may be mounted on one substrate (for instance, the first substrate 10), such that an integration degree of the devices may be increased. In addition, since the external connection terminals 28 of the first substrate 10 on which the electronic devices 1 are mounted are formed using the second substrate 20, which is a separate substrate from the first substrate 10, the external connection terminals 28 may be easily formed.

Further, in the electronic device module 100 according to the present exemplary embodiment, even in the case that the electronic devices 1 are mounted on both surfaces of the first substrate 10, all of the electronic devices 1 may be sealed by the molded portion 30 such as the first and second molded portions 31 and 35. Therefore, even in the case that the second substrate 20 is separated from the first substrate 10 or the electronic devices 1 are separated from the first substrate 10 due to heat generated in a process of mounting the electronic device module 100 on another main board (not shown), the second substrate 20 or the electronic devices 1 may be fixed by the molded portion 30.

Therefore, reliability of bonding between the electronic devices 1b and the substrate may be increased.

In addition, in the electronic device module 100 according to the present exemplary embodiment, the shielding member 40 may be disposed for the electronic devices 1b disposed on the lower surface of the first substrate 10. Therefore, the shielding member 40 may shield introduction or leakage of electromagnetic waves, such that operation performance of the electronic device module 100 may be secured.

In addition, since the shielding member 40 may not be exposed to the outside of the electronic device module 100, but may be disposed in the molded portion 30, damage to the shielding member 40 due to an external environment, friction, or the like, may be prevented.

Next, a manufacturing method of an electronic device module according to the present exemplary embodiment will be described.

FIGS. 4A through 4I are cross-sectional views for describing a manufacturing method of an electronic device module according to an exemplary embodiment in the present disclosure.

Figure 4A:
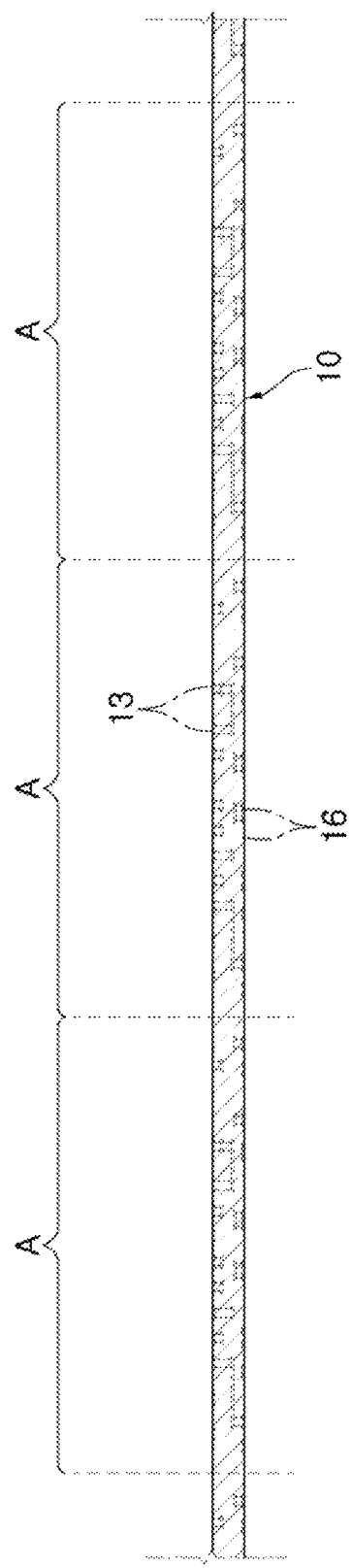

First, as shown in FIG. 4A, an operation of preparing the first substrate 10 may be performed. As described above, the first substrate 10 may be a multilayer substrate, and may have the mounting electrodes 13 formed on both surfaces thereof. In addition, the first substrate 10 may have the external connecting pads 16 formed on the lower surface thereof.

For example, the first substrate 10 prepared in the present operation of FIG. 4A may be a substrate having a plurality of same mounting regions A repeatedly disposed. The first substrate 10 may have, for example, but not limited to, a rectangular shape or a long strip shape with a wide area.

The first substrate 10 may be simultaneously manufactured to form a plurality of individual modules, mounting regions A of the plurality of individual modules may be divided on the first substrate 10, and electronic device modules 100 may be manufactured for each of the mounting regions A of the individual modules.

Then, as shown in FIG. 4B, an operation of mounting the electronic devices 1 on one surface, that is, the upper surface, of the first substrate 10 may be performed. For instance, the present operation shown in FIG. 4B may be performed by printing solder pastes on the mounting electrodes 13 formed on one surface of the first substrate 10 by a screen printing method, or the like, seating the electronic devices 1 on the solder pastes, and applying heat to harden the solder pastes.

Here, the same electronic devices 1 may be mounted on the same disposition in the respective individual module mounting regions A.

Next, as shown in FIG. 4C, an operation of forming the first molded portion 31 on one surface of the first substrate 10 so as to seal the electronic devices 1 may be performed. In the present operation of FIG. 4C, the first molded portion 31 may be formed by disposing the first substrate 10 having the electronic devices 1 mounted thereon in the mold (not shown) and injecting a molding resin into the mold. The first molded portion 31 may protect the electronic devices 1 mounted on one surface, that is, the upper surface, of the first substrate 10 from the outside.

Meanwhile, the first molded portion 31 according to the present exemplary embodiment may be formed to have an integral shape on the first substrate 10 so as to cover all of the individual module mounting regions A. However, the present disclosure is not limited thereto. The first molded portions 31 for each of the individual module mounting regions A may be formed to be separated from each other and be independently formed.

Figure 4D:
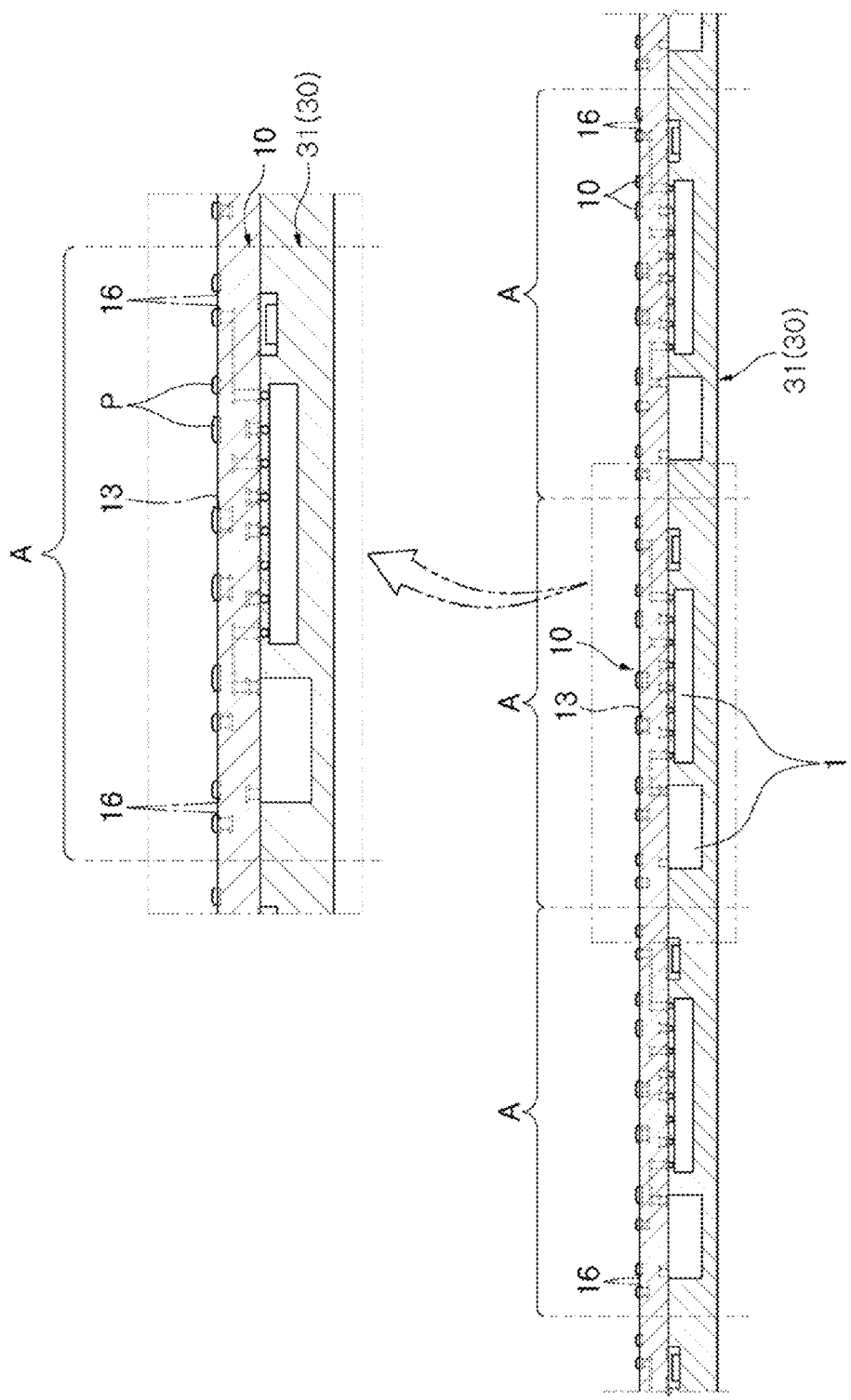

Then, as shown in FIG. 4D, an operation of printing the solder pastes P on the other surface, that is, the lower surface, of the first substrate 10 may be performed. In this case, the solder pastes P may be printed on both of the mounting electrodes 13 and the external connecting pads 16.

Figure 4E:
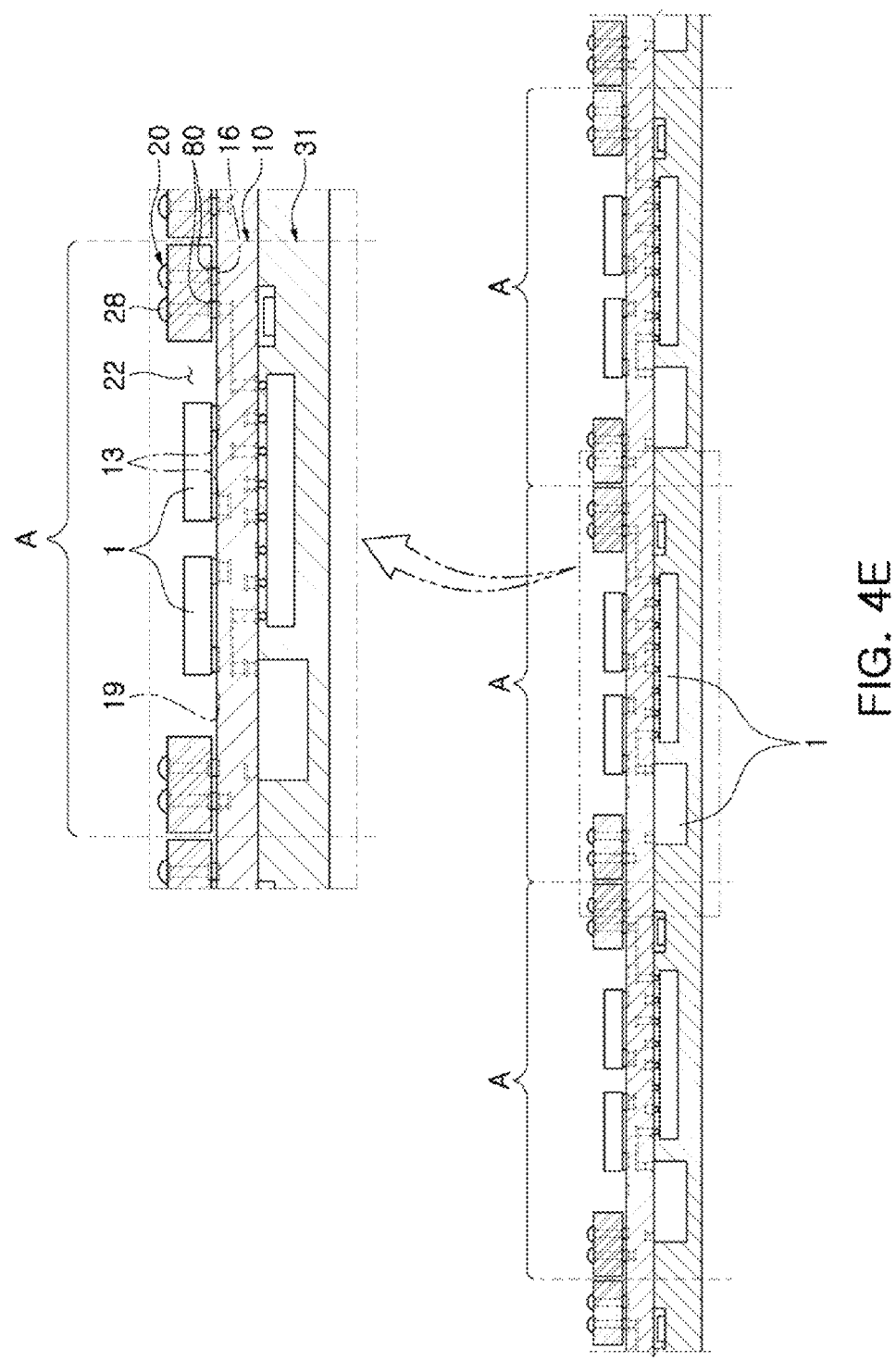

Next, as shown in FIG. 4E, an operation of mounting the electronic devices 1 and the second substrate 20 on the other surface of the first substrate 10 (e.g. the lower surface of the first substrate 10) on which the solder pastes P are printed may be performed.

In the present operation shown in FIG. 4E, a process of seating the electronic devices 1 on the mounting electrodes and seating the second substrate 20 on the external connecting pads 16 may be first performed. This process may be performed by seating the electronic devices 1 and then seating the second substrate 20. However, the present disclosure is not limited thereto, but may be performed in various schemes. That is, the second substrate 20 may be first seated or the second substrate 20 and the electronic devices 1 may be simultaneously seated.

Meanwhile, the second substrate 20 may be formed of one substrate having a plurality of individual module mounting regions A, similar to the first substrate 10, or be formed of a plurality of substrates individually attached to the plurality of individual module mounting regions A, respectively, as in the present exemplary embodiment.

That is, as the second substrate 20, a plurality of substrates having the same shape may be prepared and be repeatedly disposed in all of the individual module mounting regions A of the first substrate 10. Here, the second substrates 20 disposed adjacently to each other may be seated on the first substrate 10 so as to be spaced apart from each other by a predetermined interval.

Figure 4F:
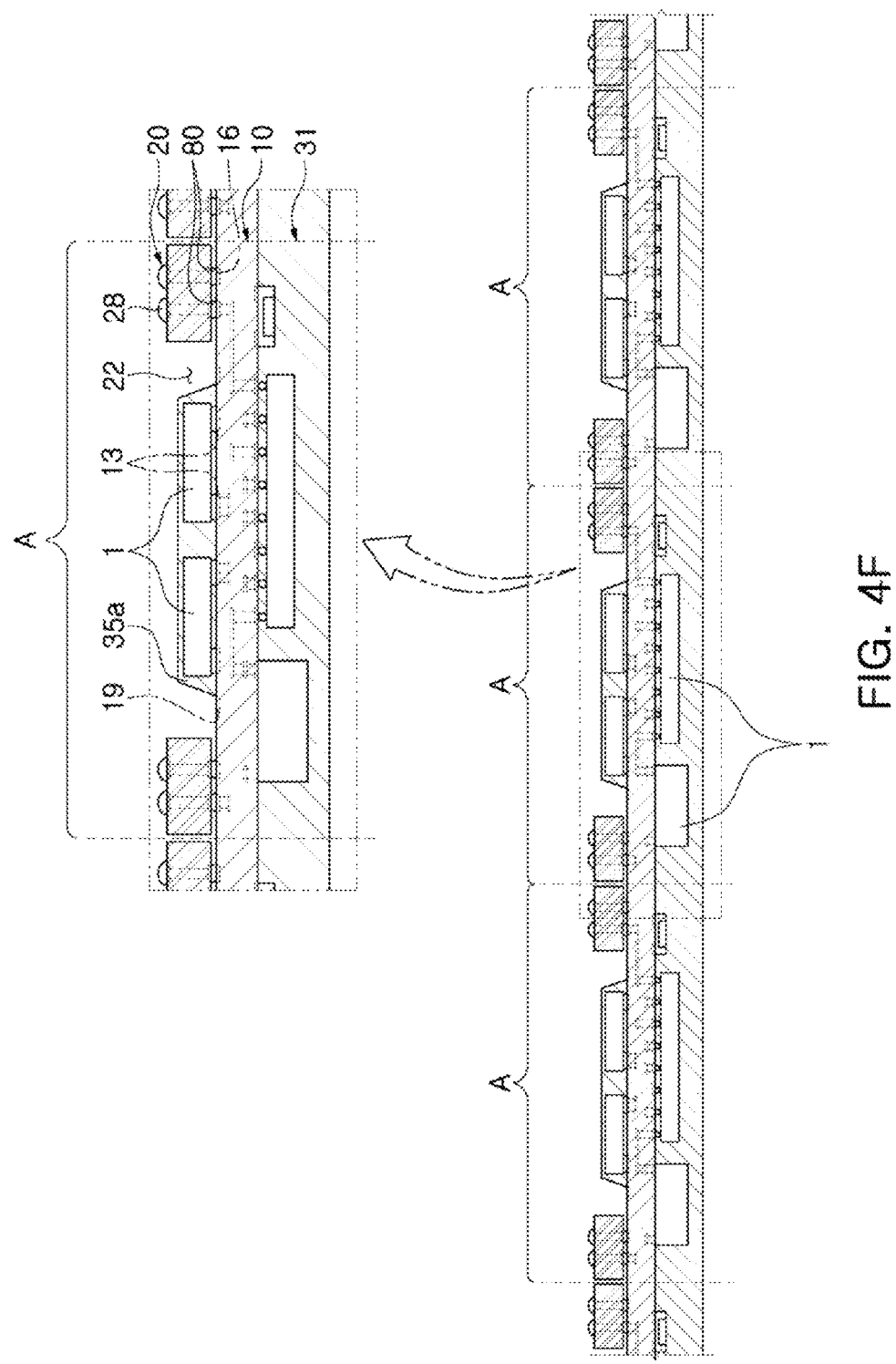
Figure 4G:
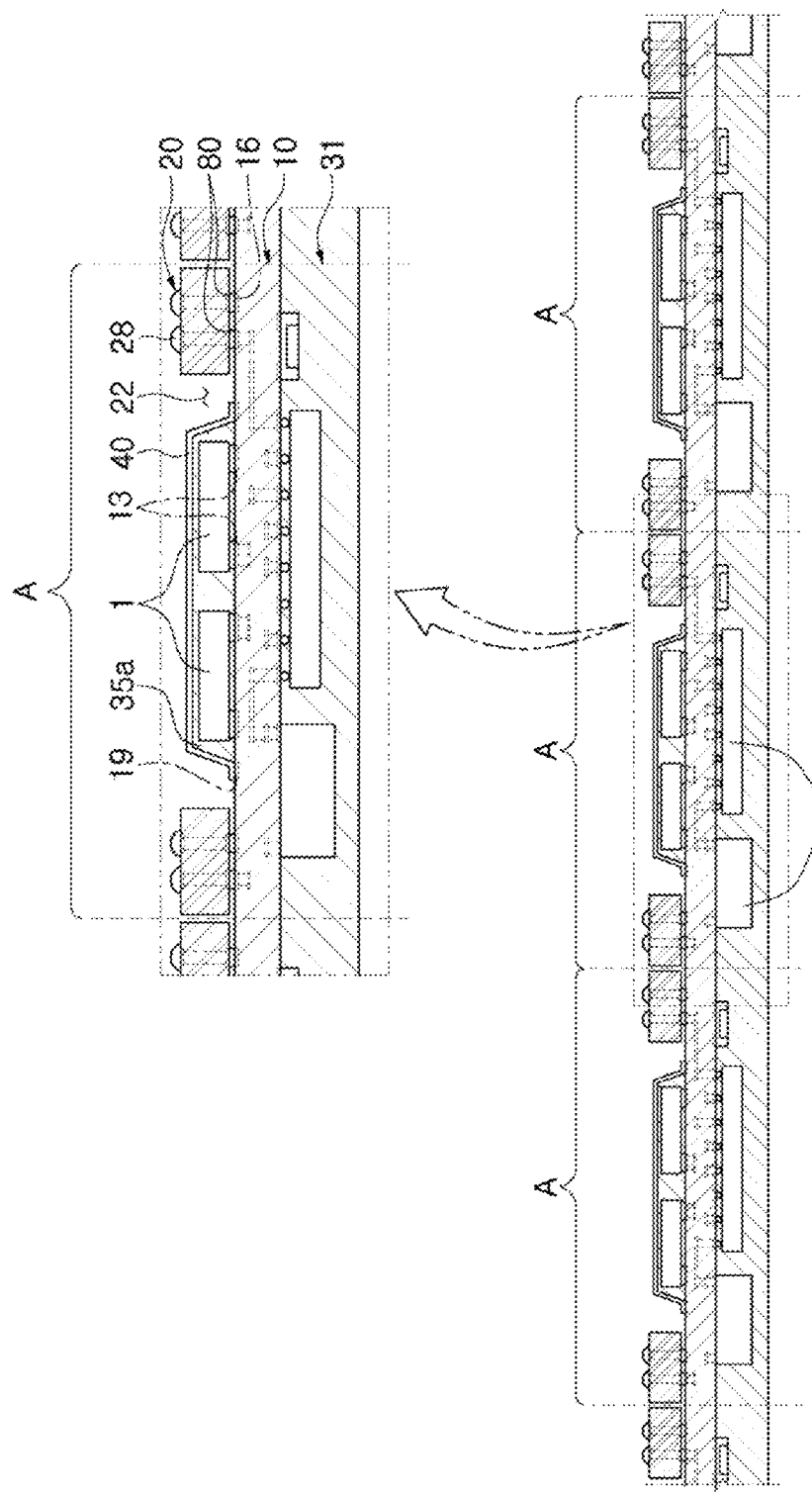

In addition, although the case in which the second substrate 20 is mounted on the first substrate 10 in a state in which the external connection terminals 28 are attached to the second substrate 20 has been shown in FIG. 4G, the present disclosure is not limited thereto, but may be variously modified. For example, the external connection terminals 28 may be attached to the second substrate 20 after the molded portions 30 are formed.

In the operation shown in FIG. 4D, when the electronic devices 1 and the second substrate 20 are seated on the other surface of the first substrate 10, heat may be applied to the solder pastes P to harden the solder pastes P. The solder pastes P may be melted and hardened through this process to become solder bonding parts 80. The electronic devices 1 and the plurality of second substrates 20 seated on the lower surface of the first substrate 10 may be firmly fixed and bonded to the first substrate 10 by the solder bonding parts 80. The solder bolding parts 80 electrically and physically connect the electronic devices 1 and the second substrates 20 to the first substrate 10.

Next, as shown in FIG. 4F, an operation of forming the second molded portion 35 on the lower surface of the first substrate 10 may be performed.

For example, in the operation shown in FIG. 4F of forming the second molded portion 35, the inner molded portion 35a may be formed first.

The inner molded portion 35a may be formed by disposing the first substrate 10 having the electronic devices 1 and the second substrate 20 mounted on the lower surface of the first substrate 10 in the mold (not shown) and injecting a molding resin into the mold, similar to the first molded portion 31.

Here, the ground pad 19 of the first substrate 10 may be exposed to the outside of the inner molded portion 35*a*.

Then, as shown in FIG. 4G, the shielding member 40 may be formed on the outer surface of the inner molded portion 35*a*. For example, the shielding member 40 may be formed to have a form of the metal thin film by the spray coating method, the screen printing method, the painting method, or the like, as described above, or may be formed by bonding a metal structure, separately manufactured, to the outer surface of the inner molded portion 35*a*.

By this process, the shielding member 40 may be electrically connected to the ground pad 19 formed on the first substrate 10.

Figure 4H:
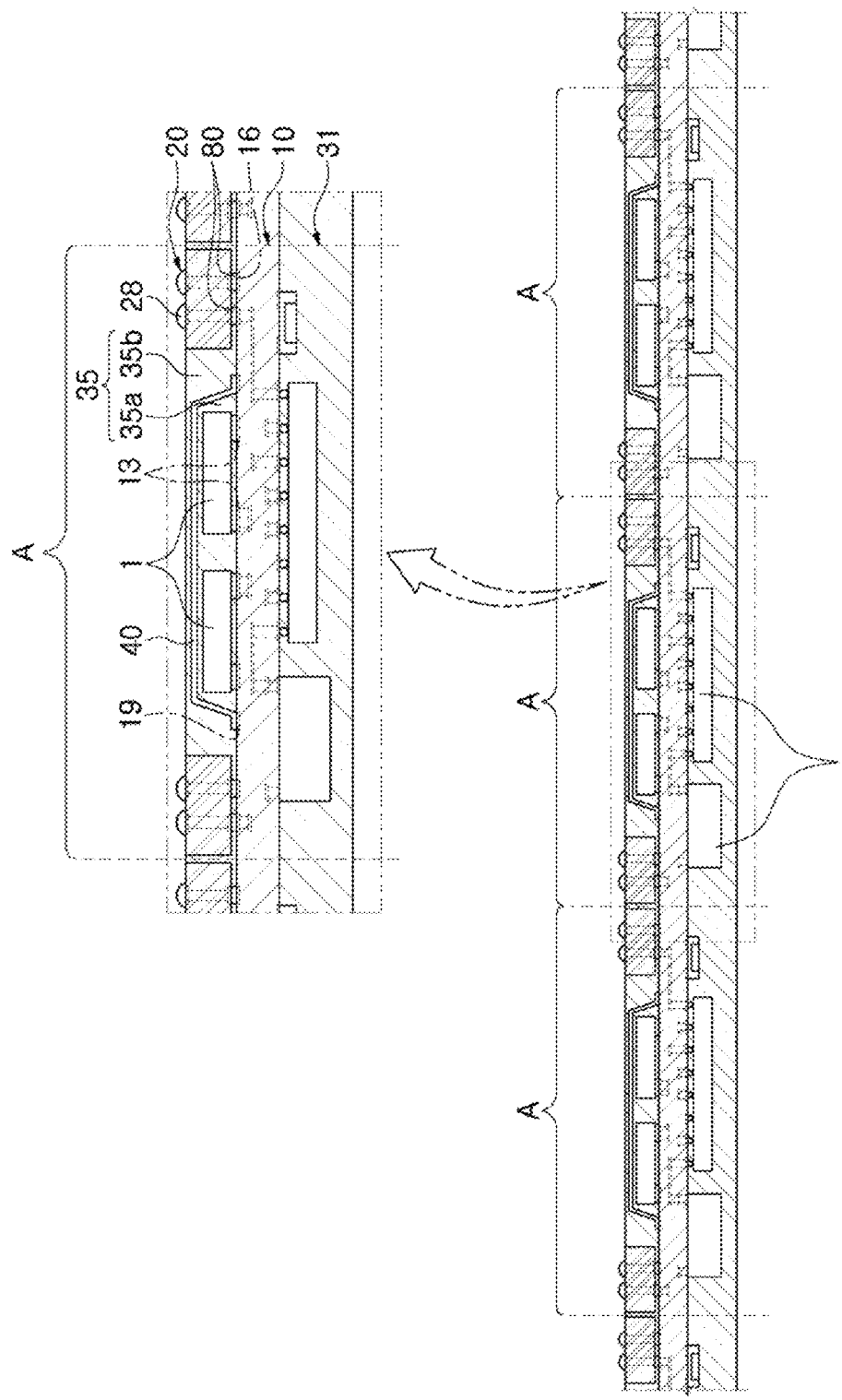

Then, as shown in FIG. 4*h*, the outer molded portion 35*b* may be formed.

The outer molded portion 35*b* may be formed by disposing the first substrate 10 having the inner molded portion 35*a* formed thereon in the mold (not shown) and injecting a molding resin into the mold, similar to the first molded portion 31. Therefore, the second molded portion 35 may be completed.

Meanwhile, in the present operation, the molding resin injected into the mold may also be filled in a gap formed between the first and second substrates 10 and 20. That is, the second molded portion 35 may also be formed in the gap formed between the first and second substrates 10 and 20.

In this case, the first and second substrates 10 and 20 may secure insulation therebetween and coupling force therebetween by the second molded portion 35 filled therebetween.

In addition, the second molded portions 35 according to the present exemplary embodiment may be formed to be separated from each other for each of the individual module mounting regions A and be independently formed. However, a configuration of the present disclosure is not limited thereto. That is, the external molded portion of the second molded portions 35 may be formed to have an integral shape so as to cover all of the individual module mounting regions A, similar to the first molded portion 31.

Figure 4I:
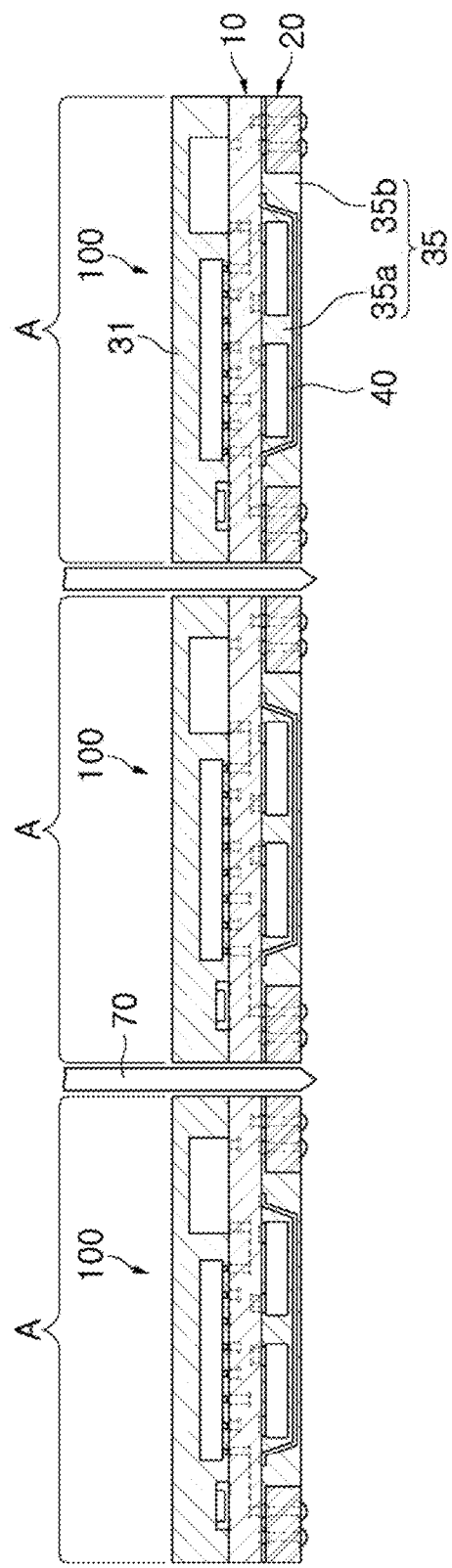

Finally, as shown in FIG. 4I, an operation of cutting the first substrate 10 having the molded portion 30 formed thereon to form individual electronic device modules 100 may be performed.

This operation may be performed by cutting the first substrate 10, having the molded portion 30 formed thereon, along boundaries of the individual module mounting regions A (See FIG. 4H) using a blade 70.

In the electronic device module 100 according to the present exemplary embodiment manufactured through the above-mentioned operations, the second substrate 20 and the electronic devices 1 (particularly, the electronic devices 1 mounted on the lower surface of the first substrate 10) may be simultaneously mounted instead of bonding the first and second substrates 10 and 20 to each other and then mounting the electronic devices 1. That is, the electronic devices 1 and the second substrate 20 may be simultaneously seated on the lower surface of the first substrate 10 and be then fixed and bonded thereto by a hardening process.

Therefore, the number of manufacturing processes may be decreased as compared with a method of individually bonding the electronic devices 1 and the second substrate 20 to the first substrate 10, such that the electronic device module 100 may be easily manufactured.

Meanwhile, the electronic device module according to the present disclosure is not limited to the above-mentioned exemplary embodiment, but may be variously applied.

Figure 5:
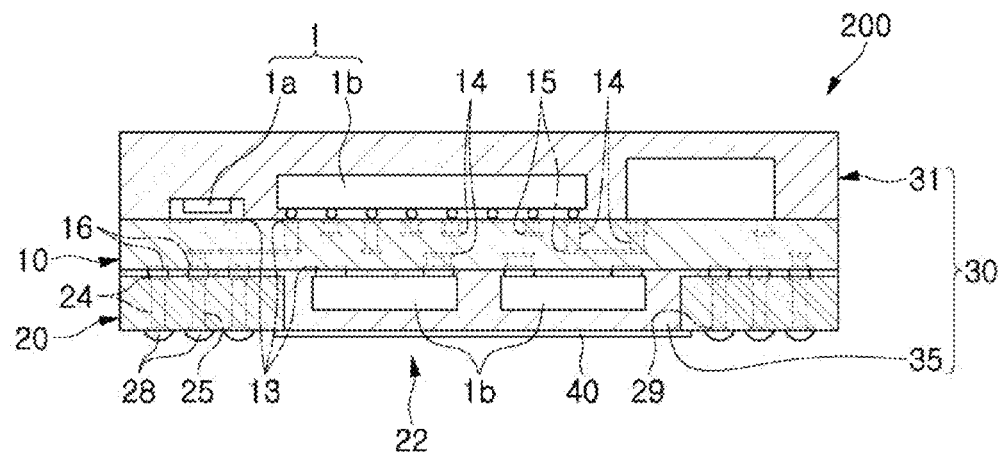
FIGS. 5 through 7 are cross-sectional views schematically showing electronic device modules according to other exemplary embodiments of the present disclosure.

FIG. 5 is a cross-sectional view schematically showing an electronic device module according to another exemplary embodiment in the present disclosure.

Referring to FIG. 5, in an electronic device module 200 according to the present exemplary embodiment, the second molded portion 35 may not be divided into the inner molded portion 35*a* and the outer molded portion 35*b*, but may be formed of one molded portion within the device accommodating part 22. The shielding member 40 may not be formed in the second molded portion 35, but may be formed along or on the outer surface of the second molded portion 35.

Therefore, the shielding member 40 may be formed at an area corresponding to or larger than that of an inlet of the device accommodating part 22.

In addition, the second substrate 20 may have at least one ground pad 29 formed on the lower surface thereof. The shielding member 40 may at least partially protrude toward the second substrate 20 and be electrically connected to the ground pad 29 formed on the second substrate 20.

The shielding member 40 according to the present exemplary embodiment may be formed by a method similar to that of the above-mentioned exemplary embodiment. For instance, the shielding member 40 may be formed on the outer surface of the second molded portion 35 by the spray coating method, the screen printing method, the painting method, or the like, after the second molded portion 35 is formed or may be formed by bonding a metal plate, separately manufactured, to the outer surface of the second molded portion 35.

In the case in which the shielding member 40 is formed on the outer surface of the second molded portion 35 as described above, the shielding member 40 may be more easily manufactured as compared with the above-mentioned exemplary embodiment.

Figure 6:
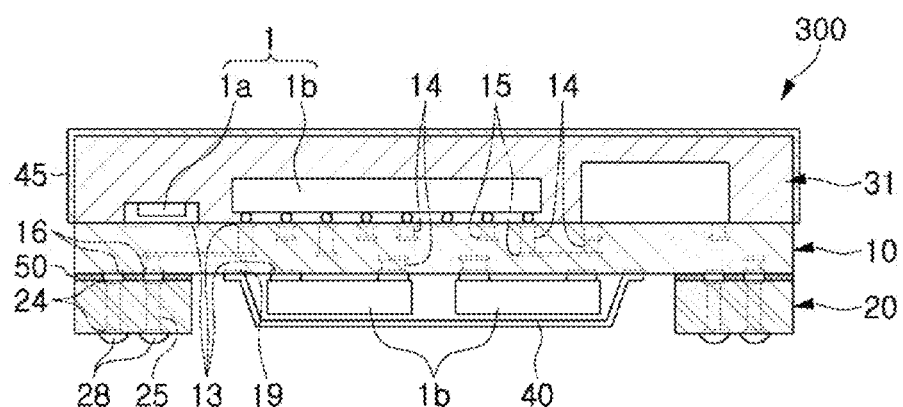

FIG. 6 is a cross-sectional view schematically showing an electronic device module according to another exemplary embodiment in the present disclosure.

Referring to FIG. 6, an electronic device module 300 according to the present exemplary embodiment may include only the first molded portion 31 without the second molded portion 35 filled in the device accommodating part 22 in the above-mentioned exemplary embodiment.

In addition, the shielding member 40 may be separately manufactured and be bonded to the lower surface of the first substrate 10.

The shielding member 40 may be formed using a structure formed of a conductive material and having a vessel shape with an internal space, accommodate the devices 1*b* mounted on the first substrate 10 in the internal space, and be bonded to the first substrate 10.

Here, the shielding member 40 may be electrically connected to the ground pad 19 of the first substrate 10.

For example, the shielding member 40 may be formed to have a metal can shape or be formed of a film thinly coated with a metal. However, the present disclosure is not limited thereto.

In addition, in the electronic device module 300 according to the present exemplary embodiment, a shielding member 45 (hereinafter, referred to as an "upper shielding member") may also be formed on an outer surface of the first molded portion 31. The upper shielding member 45 may be provided in order to protect the electronic devices 1 mounted on the upper surface of the first substrate 10 from electromagnetic waves. The upper shielding member 45 as described above may be easily applied to the electronic device modules 100 and 200 according to the above-mentioned exemplary embodiments.

Meanwhile, in the case in which the second molded portion 35 is omitted as in the present exemplary embodiment, a bonding layer 50 may be disposed between the first and second substrates 10 and 20.

The bonding layer 50 may be formed of an insulating material and be filled between the first and second substrates 10 and 20 to protect conductive members (for example, bumps, or the like) electrically connecting the first and second substrates 10 and 20 to each other. In addition, the bonding layer 50 may serve to insulate the first and second substrates 10 and 20 from each other, and improve adhesion between the first and second substrates 10 and 20 to enhance reliability.

The bonding layer 50 may be formed of an epoxy resin such as an underfill resin. However, the present disclosure is not limited thereto.

Figure 7:
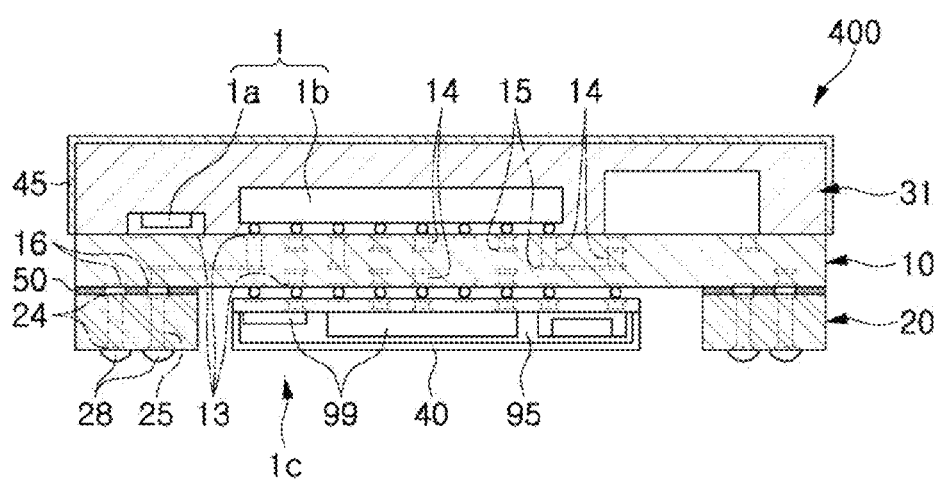

FIG. 7 is a cross-sectional view schematically showing an electronic device module according to another exemplary embodiment in the present disclosure.

Referring to FIG. 7, in an electronic device module 400 according to the present exemplary embodiment, a semiconductor package (or module) may be mounted as an electronic device 1c on the lower surface of the first substrate 10, that is, the device accommodating part 22.

Here, the semiconductor package 1c may include at least one electronic component 99 (an active device or a passive device) disposed therein, and the shielding member 40 may be formed at an external portion of the electronic component 99 in a form enclosing the electronic components 99. In addition, a molded portion 95 may be formed at external portions of the electronic components 99 in order to protect the electronic components 99.

Since the shielding member 40 is formed on an outer surface of the semiconductor package 1c, the shielding member 40 may be disposed by mounting the semiconductor package 1c (or the electronic device) without including or mounting a separate shielding member 40.

Although the case in which only one semiconductor package 1c is mounted has been described by way of example in the present exemplary embodiment, a plurality of semiconductor packages may be mounted, if necessary. In this case, various applications may be made. For example, the shielding member 40 may be formed only on an electronic device that requires the shielding of electromagnetic waves and be omitted on an electronic device that does not require the shielding of electromagnetic waves.

Meanwhile, also in the present exemplary embodiment, the bonding layer 50 may be filled between the first and second substrates 10 and 20. In addition, although the case in which the bonding layer 50 is filled only between the first and second substrates 10 and 20 has been described by way of example in the present exemplary embodiment, the bonding layer 50 may also be filled in a gap between the first substrate 10 and the semiconductor package 1c.

The electronic device module according to the present disclosure described above is not limited to the abovementioned exemplary embodiments, but may be variously applied.

As set forth above, in the electronic device module according to exemplary embodiments of the present disclosure, the shielding member 40 may be disposed for the electronic devices 1 disposed below the first substrate 10. Therefore, the shielding member 40 may shield introduction or leakage of electromagnetic waves, such that operation performance of the electronic device modules may be secured.

In addition, since the shielding member 40 may not be exposed to the outside, but is disposed in the molded portion 30, damage to the shielding member 40 due to the external environment, friction, or the like, may be prevented.

While exemplary embodiments have been shown and described above, it will be apparent to those skilled in the art that modifications and variations could be made without departing from the scope of the present invention as defined by the appended claims.

What is claimed is:

1. An electronic device module comprising:
   a first substrate having an electronic device mounted on one surface thereof;
   a second substrate bonded to the one surface of the first substrate and including a device accommodating part having a through-hole shape and accommodating the electronic device;
   an inner molded portion formed in the device accommodating part and sealing the electronic device;
   a shielding member disposed along an outer surface of the inner molded portion in the device accommodating part and accommodating the electronic device therein;
   an outer molded portion burying the shielding member therein and formed in the device accommodating part; and
   external connection terminals disposed on the second substrate and used to connect the second substrate and a main board.

2. The electronic device module of claim 1, wherein the shielding member is electrically connected to a ground pad formed on the one surface of the first substrate.

3. The electronic device module of claim 1, further comprising an electronic device mounted on an other surface of the first substrate and a molded portion formed on the other surface of the first substrate and burying the electronic device mounted on the other surface of the first substrate therein.

4. The electronic device module of claim 3, further comprising an upper shielding member disposed along an outer surface of the molded portion.

5. The electronic device module of claim 4, wherein the upper shielding member extends from a top portion of the first substrate to a top surface of the molded portion, protrudes from the top surface of the molded portion, and extends beyond a width of the first substrate and the second substrate, and wherein the first substrate is disposed between the upper shielding member and the shielding member.

6. The electronic device module of claim 1, wherein the electronic device comprises an active device and a passive device mounted on an upper surface of the first substrate, and only an active device mounted on a lower surface of the first substrate.

7. The electronic device module of claim 1, wherein the shielding member is formed as a U-shaped vessel spanning a width less than that of the first substrate.

8. An electronic device module comprising:
   a first substrate having electronic devices mounted on both surfaces thereof;
   a second substrate bonded to one surface of the first substrate and including a device accommodating part having a through-hole shape and accommodating one of the electronic devices; an inner molded portion formed in the device accommodating part and sealing the electronic device;
   a shielding member disposed along an outer surface of the inner molded portion in the device accommodating part, and shielding electromagnetic waves from being introduced into the electronic device disposed in the device accommodating part and/or shielding the electromagnetic waves from being leaked from the electronic device; an outer molded portion burying the shielding therein and formed in the device accommodating part; and external connection terminals disclosed on the second substrate and used to connect the second substrate and a main board.

9. A manufacturing method of an electronic device module, comprising:

preparing a first substrate;

mounting one electronic device and a second substrate on one surface of the first substrate; and forming a shielding member over the electronic device, wherein in the mounting of the electronic device and the second substrate, the electronic device is mounted in a device accommodating part which is formed in the second substrate and has a through-hole shape, wherein the forming of the shielding member includes;

forming an inner molded portion sealing the electronic device disposed in the device accommodating part, forming the shielding member along an outer surface of the inner molded portion, and forming an outer molded portion to bury the shielding member therein and formed in the device accommodating part, wherein the second substrate includes external connecting terminals used to connect the second substrate and a main board.

\* \* \* \* \*